United States Patent
Yagi et al.

(10) Patent No.: US 10,741,591 B2
(45) Date of Patent: Aug. 11, 2020

(54) SEMICONDUCTOR INTEGRATED OPTICAL DEVICE

(71) Applicants: SUMITOMO ELECTRIC INDUSTRIES, LTD., Osaka (JP); SUMITOMO ELECTRIC DEVICE INNOVATIONS, INC., Kanagawa (JP)

(72) Inventors: Hideki Yagi, Osaka (JP); Naoko Konishi, Osaka (JP); Koji Ebihara, Yokohama (JP); Takuya Okimoto, Yokohama (JP)

(73) Assignees: SUMITOMO ELECTRIC INDUSTRIES, LTD., Osaka (JP); SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/283,191

(22) Filed: Feb. 22, 2019

(65) Prior Publication Data

US 2019/0267412 A1  Aug. 29, 2019

(30) Foreign Application Priority Data

Feb. 27, 2018  (JP) ................................. 2018-033422

(51) Int. Cl.
  *H01L 27/144* (2006.01)
  *H01L 31/0352* (2006.01)
  (Continued)

(52) U.S. Cl.
  CPC ...... *H01L 27/1443* (2013.01); *G02B 6/12004* (2013.01); *G02B 6/131* (2013.01);
  (Continued)

(58) Field of Classification Search
  CPC ............. H01L 27/1443; H01L 31/1844; H01L 31/03046; H01L 31/105; H01L 31/02327;
  (Continued)

(56) References Cited

U.S. PATENT DOCUMENTS

| | | | | |
|---|---|---|---|---|
| 2011/0266646 A1* | 11/2011 | Uemura | ................ | H01L 21/762 257/503 |
| 2012/0106984 A1* | 5/2012 | Jones | ..................... | H04B 10/60 398/214 |
| 2012/0207474 A1* | 8/2012 | Inoue | ..................... | H04B 10/60 398/65 |
| 2013/0071129 A1* | 3/2013 | Yoneda | .............. | G02B 6/12004 398/214 |

(Continued)

OTHER PUBLICATIONS

Tang, Yongbo, et al., High Performance DP-QPSK Receiver Module incorporating InP-based Integrated Coherent Integrated Coherent Detection Chip OFC, pM3C.3.pdf (2015).

*Primary Examiner* — Fernando L Toledo
*Assistant Examiner* — Adam S Bowen
(74) *Attorney, Agent, or Firm* — Smith, Gambrell & Russell, LLP

(57) ABSTRACT

A semiconductor integrated optical device includes: a supporting base including semi-insulating semiconductor; a first photoelectric convertor having first photodiode mesas; a second photoelectric convertor having second photodiode mesas; a first 90° optical hybrid having at least one first multimode waveguide mesa; a second 90° optical hybrid having at least one second multimode waveguide mesa; an optical divider mesa; first and second input waveguide mesas coupling the first and second 90° optical hybrids with the optical divider mesa, respectively; a conductive semiconductor region disposed on the supporting base, the conductive semiconductor region mounting the first photodiode mesas, the second photodiode mesas, the first multimode waveguide mesas, the second multimode waveguide mesas, and the optical divider mesa; a first island semiconductor mesa extending between the first and second multimode waveguide mesas; and a first groove extending through the first island semiconductor mesa and the conductive semiconductor region to the semi-insulating semiconductor.

7 Claims, 14 Drawing Sheets

(51) Int. Cl.
  *H01L 31/0232* (2014.01)
  *H01L 31/105* (2006.01)
  *H01L 31/0304* (2006.01)
  *H01L 31/18* (2006.01)
  *G02B 6/12* (2006.01)
  *G02B 6/13* (2006.01)
  *G02B 6/136* (2006.01)

(52) U.S. Cl.
  CPC ........ *G02B 6/136* (2013.01); *H01L 31/02327* (2013.01); *H01L 31/03046* (2013.01); *H01L 31/035281* (2013.01); *H01L 31/105* (2013.01); *H01L 31/1844* (2013.01); *G02B 2006/12078* (2013.01); *G02B 2006/12097* (2013.01); *G02B 2006/12123* (2013.01); *G02B 2006/12138* (2013.01)

(58) Field of Classification Search
  CPC . H01L 31/035281; G02B 6/136; G02B 6/131; G02B 6/12004; G02B 2006/12138; G02B 2006/12123; G02B 2006/12078; G02B 2006/12097
  USPC .......................................................... 257/432
  See application file for complete search history.

(56) References Cited

U.S. PATENT DOCUMENTS

| | | | |
|---|---|---|---|
| 2013/0236136 A1* | 9/2013 | Nara | G02B 6/126 385/11 |
| 2013/0330038 A1* | 12/2013 | Onishi | G02B 6/262 385/31 |
| 2014/0070351 A1* | 3/2014 | Masuyama | H01L 31/02325 257/432 |
| 2014/0246746 A1* | 9/2014 | Yoneda | H01L 31/105 257/432 |
| 2015/0049984 A1* | 2/2015 | Kato | G02F 1/225 385/31 |
| 2015/0260933 A1* | 9/2015 | Masuyama | G02B 6/4274 385/14 |
| 2015/0277069 A1* | 10/2015 | Okamoto | G02B 6/4274 385/14 |
| 2016/0011439 A1* | 1/2016 | Kitamura | G02F 1/2255 385/2 |
| 2016/0026064 A1* | 1/2016 | Masuyama | G02F 1/025 385/2 |
| 2016/0284876 A1* | 9/2016 | Yagi | H01L 31/02005 |
| 2016/0285561 A1* | 9/2016 | Wu | G02B 6/305 |
| 2016/0380023 A1* | 12/2016 | Yoneda | H01L 31/184 257/432 |
| 2017/0099110 A1* | 4/2017 | Ogawa | G02B 6/125 |
| 2017/0192173 A1* | 7/2017 | Evans | G02B 6/1225 |

* cited by examiner

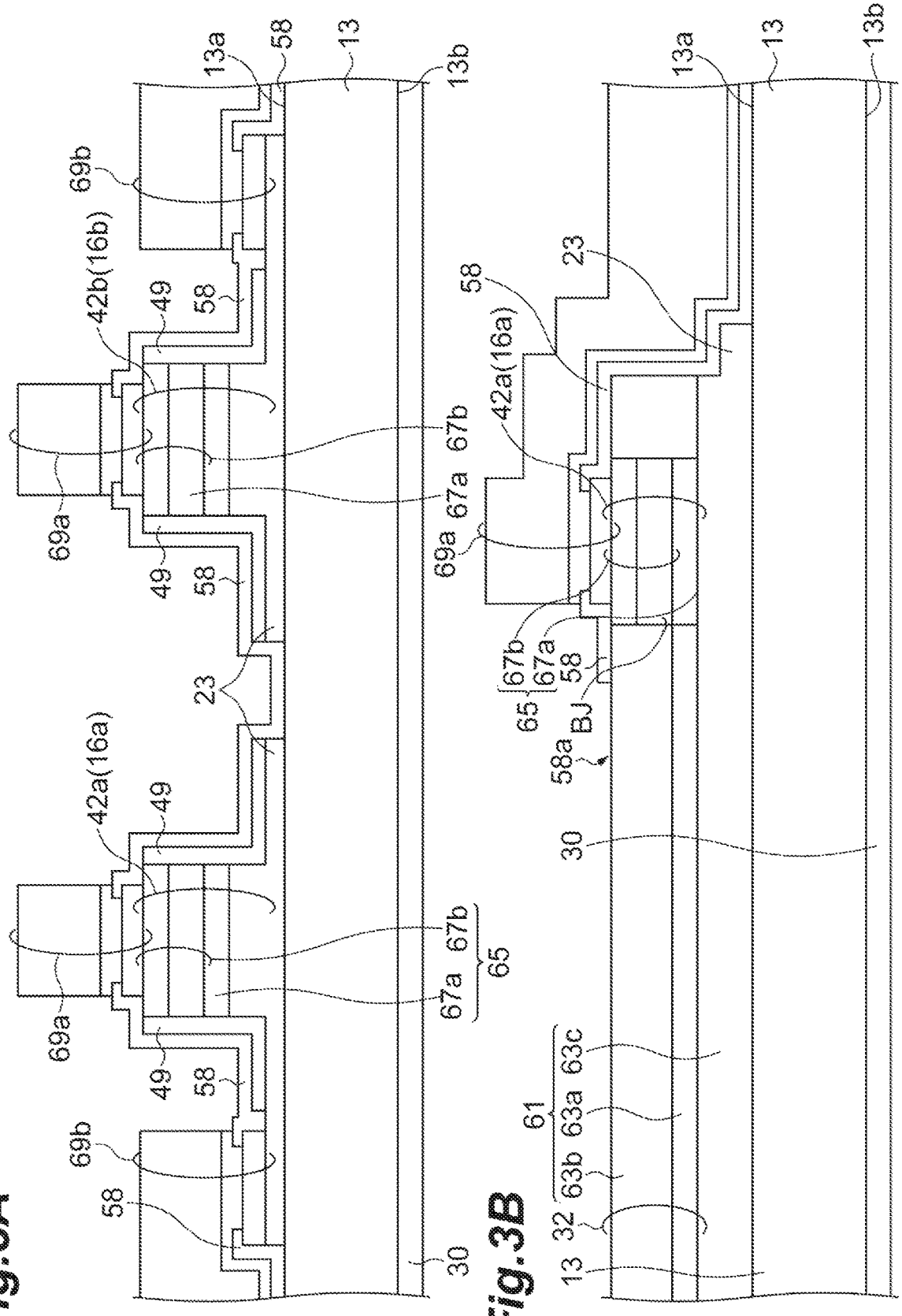

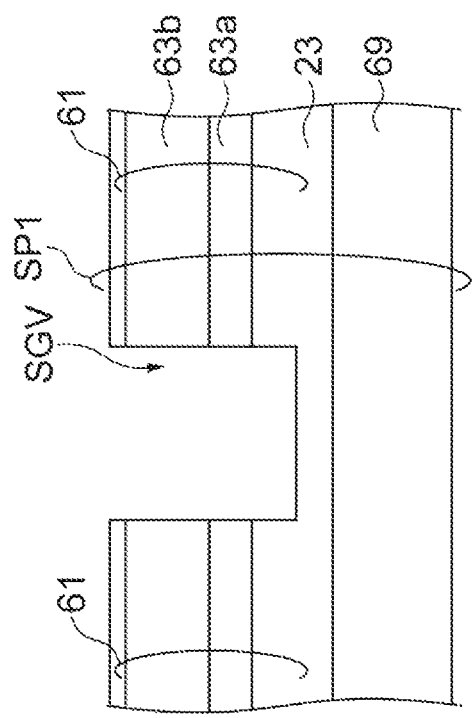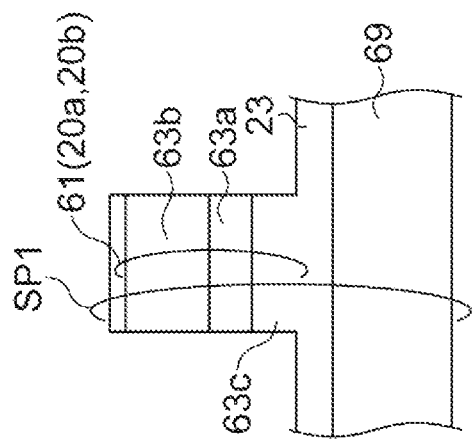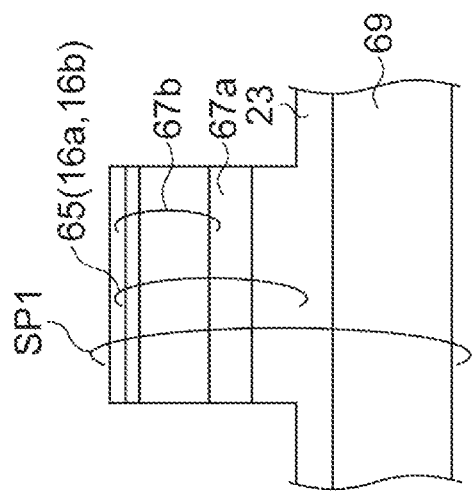

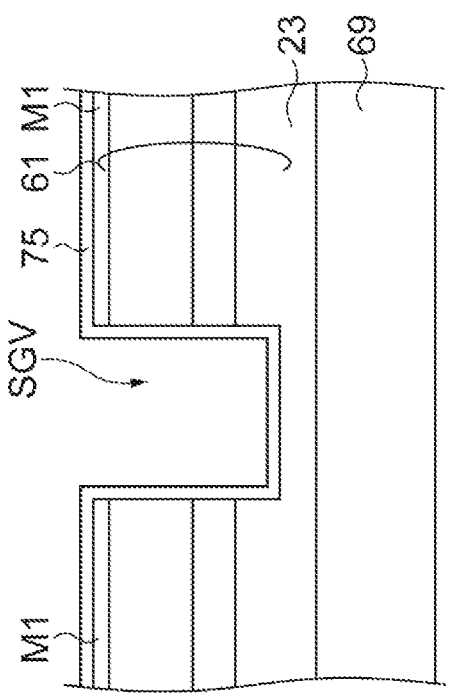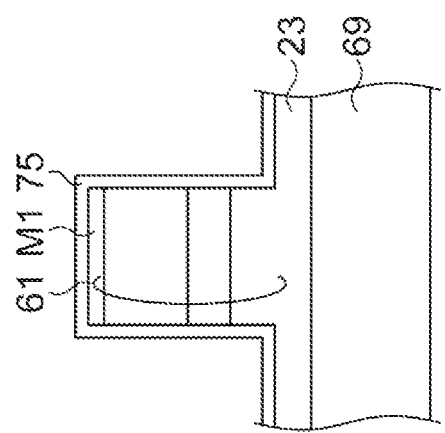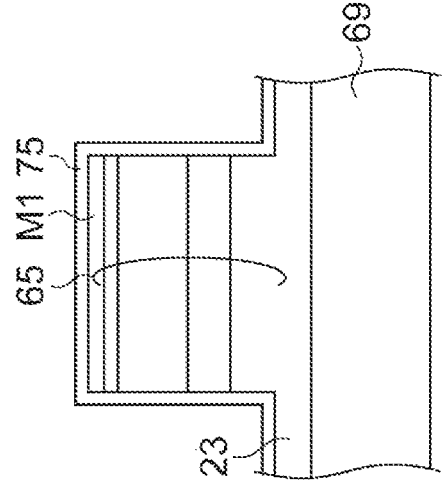

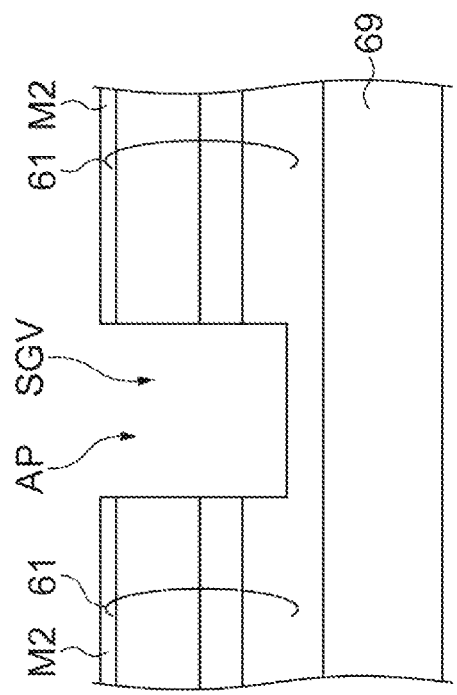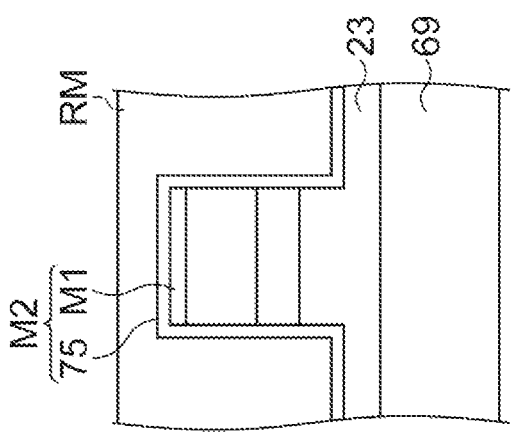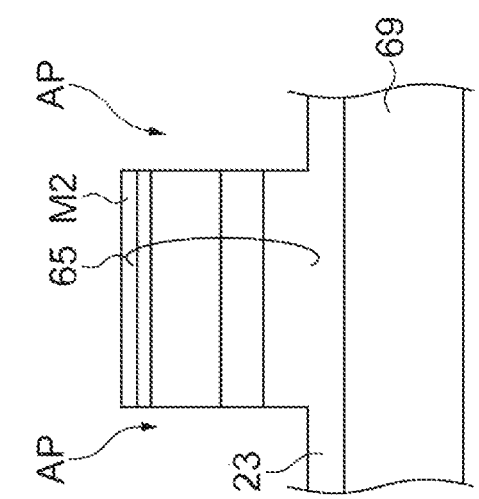

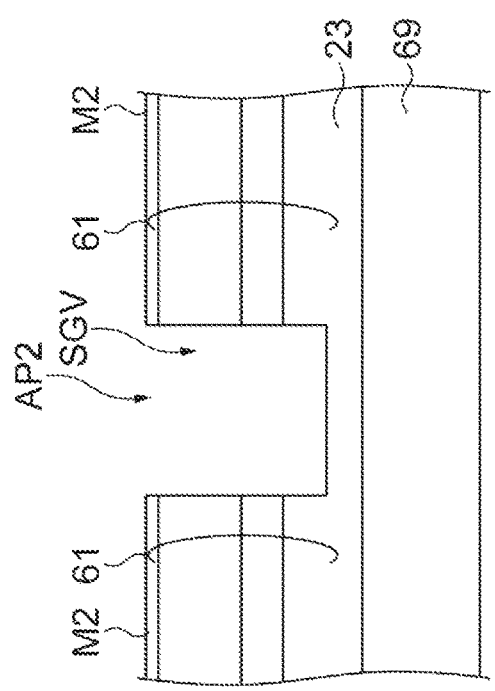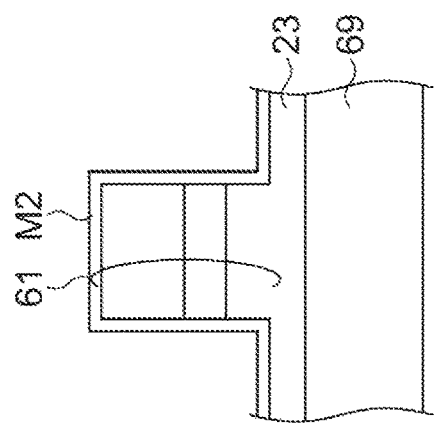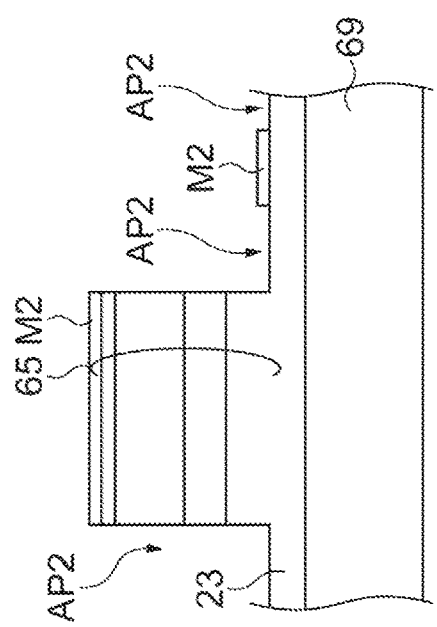

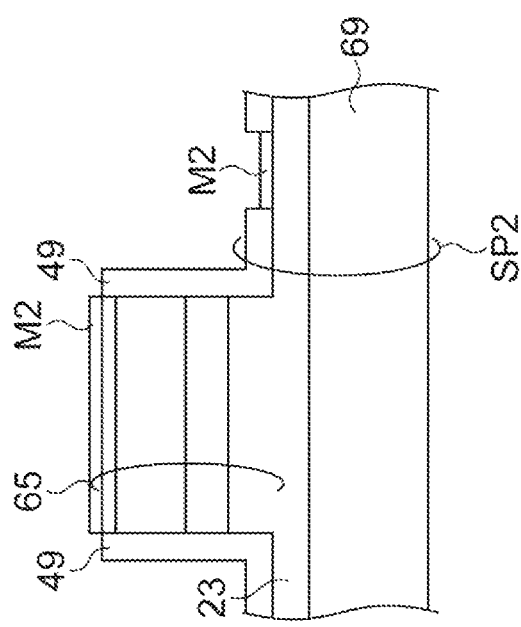
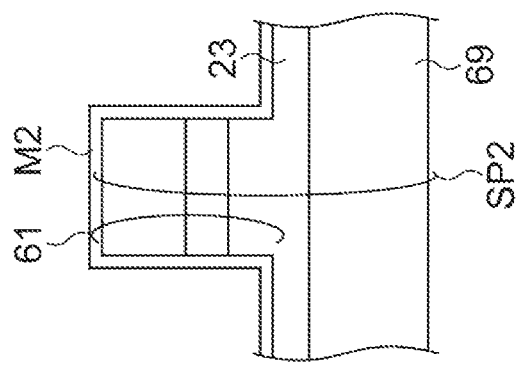
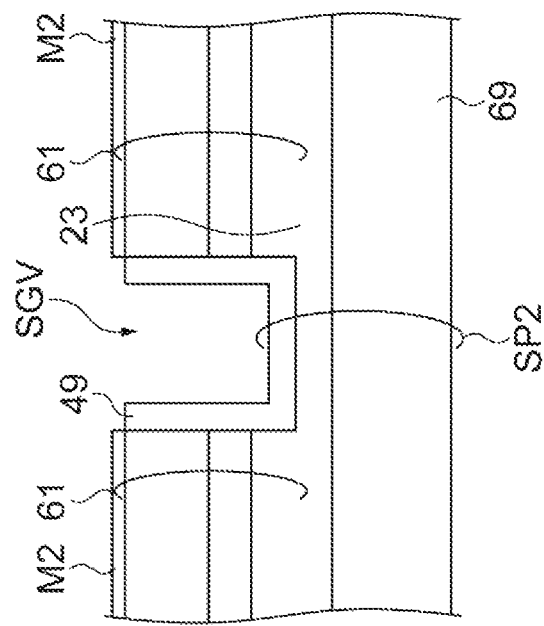

SEMICONDUCTOR INTEGRATED OPTICAL DEVICE

BACKGROUND OF THE INVENTION

Field of the Invention

The present invention relates to a semiconductor integrated optical device. This application claims the benefit of priority from Japanese Patent application No. 2018-033422 filed on Feb. 27, 2018, which is herein incorporated by reference in its entirety.

Related Background Art

Yongbo Tang, Fang Wu, Yury Logvin, Jiangqing Lei, Guolin Liu, Ke Luo, Chris Watson1, Kirill Pimenov, Yingying Bai, Denis Massonl, Valery Tolstikhin, HongXie, Yimin Hua "High Performance DP-QPSK Receiver Module incorporating InP-based Integrated Coherent Detection Chip", OFC 2015, referred to as Non-Patent Document 1, discloses an InP-based coherent detection chip.

SUMMARY OF THE INVENTION

A semiconductor integrated optical device according to one aspect of the embodiment includes: a supporting base including semi-insulating semiconductor; a conductive semiconductor region disposed on a principal face of the supporting base; a first photoelectric convertor having first photodiode mesas on the conductive semiconductor region; a second photoelectric convertor having second photodiode mesas on the conductive semiconductor region; a first 90° optical hybrid optically coupled to the first photoelectric convertor, the first 90° optical hybrid having at least one first multimode waveguide mesa on the conductive semiconductor region; a second 90° optical hybrid optically coupled to the second photoelectric convertor, the second 90° optical hybrid having at least one second multimode waveguide mesa on the conductive semiconductor region; an optical divider mesa disposed on the supporting base; a first input waveguide mesa disposed on the conductive semiconductor region, the first input waveguide mesa coupling the optical divider mesa with the first 90° optical hybrid; a second input waveguide mesa disposed on the conductive semiconductor region, the second input waveguide mesa coupling the optical divider mesa with the second 90° optical hybrid; a first island semiconductor mesa extending between the first multimode waveguide mesa and the second multimode waveguide mesa, the first island semiconductor mesa being disposed on the conductive semiconductor region; and a first groove extending in a direction of a first axis to penetrate through the first island semiconductor mesa and the conductive semiconductor region to the semi-insulating semiconductor of the supporting base, the first axis intersecting the principal face.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 3A is a schematic cross sectional view taken along line IIIa-IIIa shown in FIG. 1.

FIG. 3B is a schematic cross sectional view taken along line IIIb-IIIb shown in FIG. 1.

FIG. 7A is a schematic cross sectional view showing a major step in the method according to the embodiment.

FIG. 7B is a schematic cross sectional view showing a major step in the method according to the embodiment.

FIG. 7C is a schematic cross sectional view showing a major step in the method according to the embodiment.

FIG. 8A is a schematic cross sectional view showing a major step in the method according to the embodiment.

FIG. 8B is a schematic cross sectional view showing a major step in the method according to the embodiment.

FIG. 8C is a schematic cross sectional view showing a major step in the method according to the embodiment.

FIG. 9A is a schematic cross sectional view showing a major step in the method according to the embodiment.

FIG. 9B is a schematic cross sectional view showing a major step in the method according to the embodiment.

FIG. 9C is a schematic cross sectional view showing a major step in the method according to the embodiment.

FIG. 11A is a schematic cross sectional view showing a major step in the method according to the embodiment.

FIG. 11B is a schematic cross sectional view showing a major step in the method according to the embodiment.

FIG. 11C is a schematic cross sectional view showing a major step in the method according to the embodiment.

FIG. 12A is a schematic cross sectional view showing a major step in the method according to the embodiment.

FIG. 12B is a schematic cross sectional view showing a major step in the method according to the embodiment.

FIG. 12C is a schematic cross sectional view showing a major step in the method according to the embodiment.

DESCRIPTION OF THE EMBODIMENTS

Figure 1:
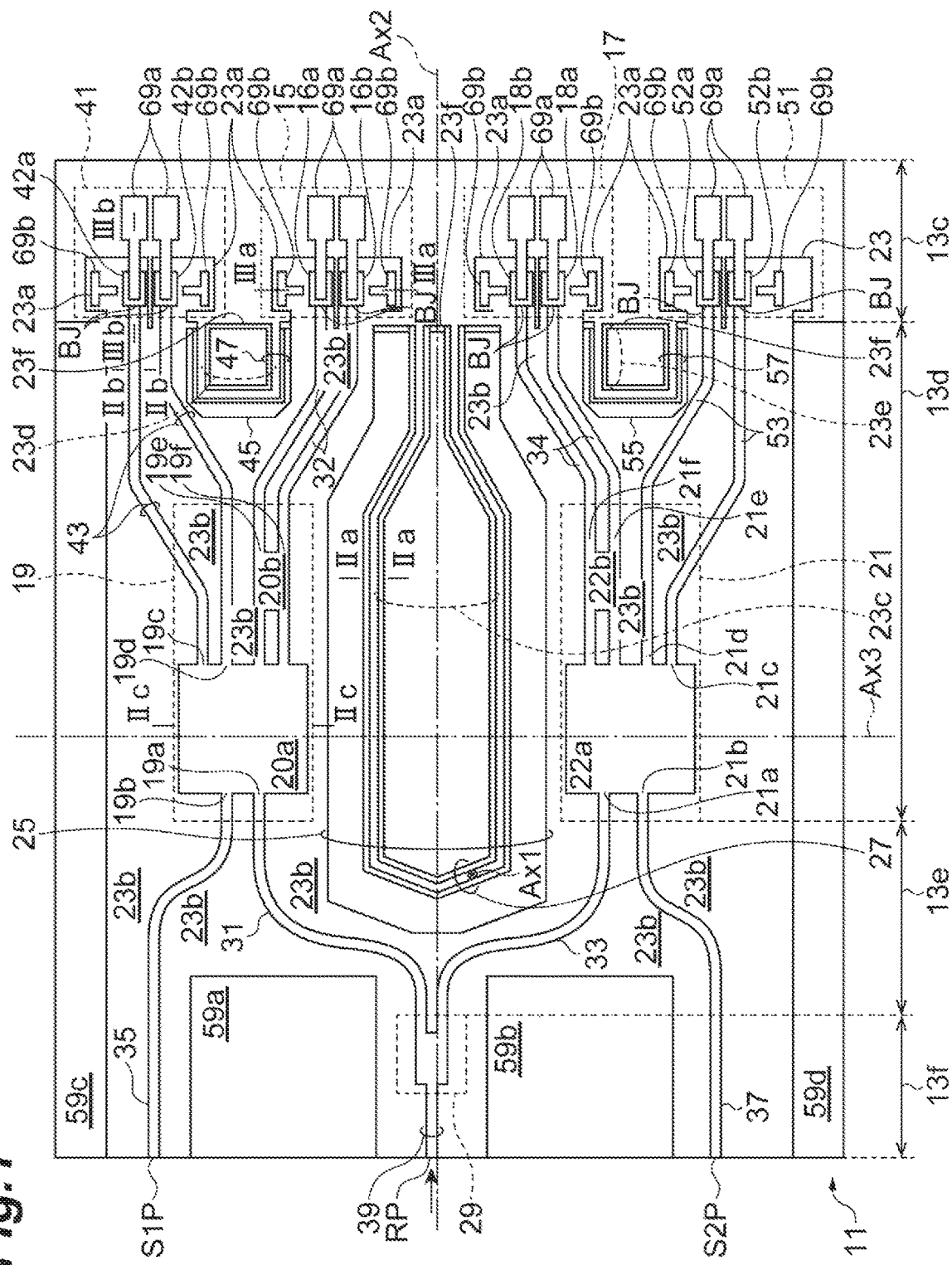
FIG. 1 is a schematic plan view showing a semiconductor integrated optical device according to an embodiment.

Non-patent document 1 includes 2×4 multimode interferometers (MMI) for the X- and Y-channels of the optical receiving module, and these 2×4 multimode interferometers receive respective light beams from an input beam splitter in the optical receiving module. The 2×4 multimode interferometers each supply, to the four photodiodes, respective interfering light signals. The four photodiodes in the X-channel convert the X-channel interfering optical signals from the X-channel 2×4 multimode interferometer into respective electrical signals, and the four photodiodes in the Y-channel also convert the Y-channel interfering optical signals from the Y-channel 2×4 multimode interferometer into respective electrical signals What is desired is to reduce crosstalk in the optical receiver module. The inventors' studies, however, reveal that modification in the placement of electrical components, such as semiconductor optical device, in the optical receiving module and the routing of electrical conductors between the electrical components and the photodiodes for the X- and Y-channels cannot offer the optical receiving module little improvement in crosstalk. The crosstalk still remains in the optical receiving module. There is a need for a semiconductor integrated optical device capable of reducing electrical crosstalk in an optical receiving module.

A description will be given of examples according to the embodiment.

A semiconductor integrated optical device according to an example of the embodiment includes: (a) a supporting base including semi-insulating semiconductor; (b) a conductive semiconductor region disposed on a principal face of the supporting base; (c) a first photoelectric convertor having a first photodiode mesas on the conductive semiconductor region; (d) a second photoelectric convertor having second photodiode mesas on the conductive semiconductor region; (e) a first 90° optical hybrid optically coupled to the first photoelectric convertor, the first 90° optical hybrid having at least one first multimode waveguide mesa on the conductive semiconductor region; (f) a second 90° optical hybrid optically coupled to the second photoelectric convertor, the second 90° optical hybrid having at least one second multimode waveguide mesa on the conductive semiconductor region; (g) an optical divider mesa disposed on the supporting base; (h) a first input waveguide mesa disposed on the conductive semiconductor region, the first input waveguide mesa coupling the optical divider mesa with the first 90° optical hybrid; (i) a second input waveguide mesa disposed on the conductive semiconductor region, the second input waveguide mesa coupling the optical divider mesa with the second 90° optical hybrid; (j) a first island semiconductor mesa extending between the first multimode waveguide mesa and the second multimode waveguide mesa, the first island semiconductor mesa being disposed on the conductive semiconductor region; and (k) a first groove extending in a direction of a first axis to penetrate through the first island semiconductor mesa and the conductive semiconductor region to the semi-insulating semiconductor of the supporting base, the first axis intersecting the principal face.

In the semiconductor integrated optical device according to an example of the embodiment, the supporting base has a first region, a second region, a third region, and a fourth region, and the first region, the second region, the third region, and the fourth region are arranged along a second axis intersecting the first axis. The first photodiode mesas of the first photoelectric convertor may be disposed on the first region. The second photodiode mesas of the second photoelectric convertor are disposed on the first region. The first multimode waveguide mesas of the first 90° optical hybrid may be disposed on the second region. The second multimode waveguide mesas of the second 90° optical hybrid may be disposed on the second region. The optical divider mesa may be disposed on the fourth region. The first input waveguide mesa may be disposed on the third region. The second input waveguide mesa may be disposed on the third region, and the first island semiconductor mesa may be disposed on the second region and the third region.

A semiconductor integrated optical device according to an example of the embodiment includes: (a) a supporting base having a first region, a second region, a third region, and a fourth region, the supporting base including semi-insulating semiconductor; (b) a first photoelectric convertor having a first photodiode mesa on the first region; (c) a second photoelectric convertor having a second photodiode mesa on the first region; (d) a first 90° optical hybrid optically coupled to the first photoelectric convertor, the first 90° optical hybrid having one or more first multimode waveguide mesas, and the first multimode waveguide mesas being disposed on the second region; (e) a second 90° optical hybrid optically coupled to the second photoelectric convertor, the second 90° optical hybrid having one or more second multimode waveguide mesas, and the second multimode waveguide mesas being disposed on the second region; (f) an optical divider mesa disposed on the fourth region; (g) a first input waveguide mesa disposed on the third region, the first input waveguide mesa coupling the optical divider mesa with the first 90° optical hybrid; (h) a second input waveguide mesa disposed on the third region, the second input waveguide mesa coupling the optical divider mesa with the second 90° optical hybrid; (i) a conductive semiconductor region disposed on a principal face of the supporting base, the conductive semiconductor region mounting the first photodiode mesa, the second photodiode mesa, the first multimode waveguide mesas, the second multimode waveguide mesas, and the optical divider mesa; (j) a first island semiconductor mesa disposed between the first multimode waveguide mesas and the second multimode waveguide mesas, the first island semiconductor mesa being disposed on the second region and the third region; and (k) a first groove extending in a direction of a first axis to penetrate through the first island semiconductor mesa and the conductive semiconductor region to the semi-insulating semiconductor of the supporting base, the first axis intersecting the principal face.

The semiconductor integrated optical device is provided with the island semiconductor mesa, which is disposed on the second and third regions and extends between the first and second multimode waveguide mesas. The semiconductor integrated optical device is provided with the first groove, which penetrates through the first island semiconductor mesa and the conductive semiconductor region to the semi-insulating semiconductor of the supporting base in the second region. The first island semiconductor mesa allows the first groove to narrow the electrical path connecting the first photodiode mesa(s) in the first photoelectric converter, which is connected to the first 90° optical hybrid, and the second photodiode mesa(s) in the second photoelectric converter, which is connected to the second 90° optical hybrid. In addition, the first island semiconductor mesa circumvents the electrical path by use of the groove to lengthen the path.

The semiconductor integrated optical device according to an example of the embodiment further includes: first waveguide mesas connecting the first multimode waveguide mesas with the first photodiode mesas; second waveguide mesas connecting the second multimode waveguide mesas with the second photodiode mesas; a third photoelectric convertor having third photodiode mesas on the first region; third waveguide mesas connecting the first multimode waveguide mesas with the third photodiode mesas; a second island semiconductor mesa extending between the first waveguide mesas and the third waveguide mesas, the second island semiconductor mesa being disposed on the second region; and a second groove extending in the direction of the first axis to penetrate through the second island semiconductor mesa and the conductive semiconductor region to the semi-insulating semiconductor of the supporting base.

The semiconductor integrated optical device is provided with the second island semiconductor mesa, which is disposed between the first and third waveguide mesas on the second region. The semiconductor integrated optical device is provided with the first groove that penetrates through the second island semiconductor mesa and the conductive semiconductor region in the second region to the semi-insulating semiconductor of the supporting base. The second island semiconductor mesa allows the second groove to narrow the electrical path connecting the first photodiode mesas in the first photoelectric converter with the third photodiode mesas in the third photoelectric converter. In addition, the second island semiconductor mesa circumvents the electrical path by use of the second groove to lengthen the path.

The semiconductor integrated optical device according to an example of the embodiment further includes an insulating layer having openings on the first multimode waveguide mesas and the second multimode waveguide mesas, the insulating layer covering the first photodiode mesas, the second photodiode mesas, and the first island semiconductor mesa, and the insulating layer being disposed in the first groove.

The semiconductor integrated optical device is provided with the insulating layer that cover the first island semiconductor mesa and the first-conductivity type semiconductor region.

The semiconductor integrated optical device according to an example of the embodiment further includes a high specific-resistance layer covering the first island semiconductor mesa and the conductive semiconductor region on the first region, and the high specific-resistance region has a specific resistance higher than that of the conductive semiconductor region.

The semiconductor integrated optical device is provided with the high specific-resistance semiconductor layer that makes contact with the first island semiconductor mesa and the conductive semiconductor region.

Teachings of the present invention can be readily understood by considering the following detailed description with reference to the accompanying drawings shown as examples. Referring to the accompanying drawings, a semiconductor integrated optical device according to examples of the present embodiment will be described below. To facilitate understanding, identical reference numerals are used, where possible, to designate identical elements that are common to the figures.

Figure 2A:
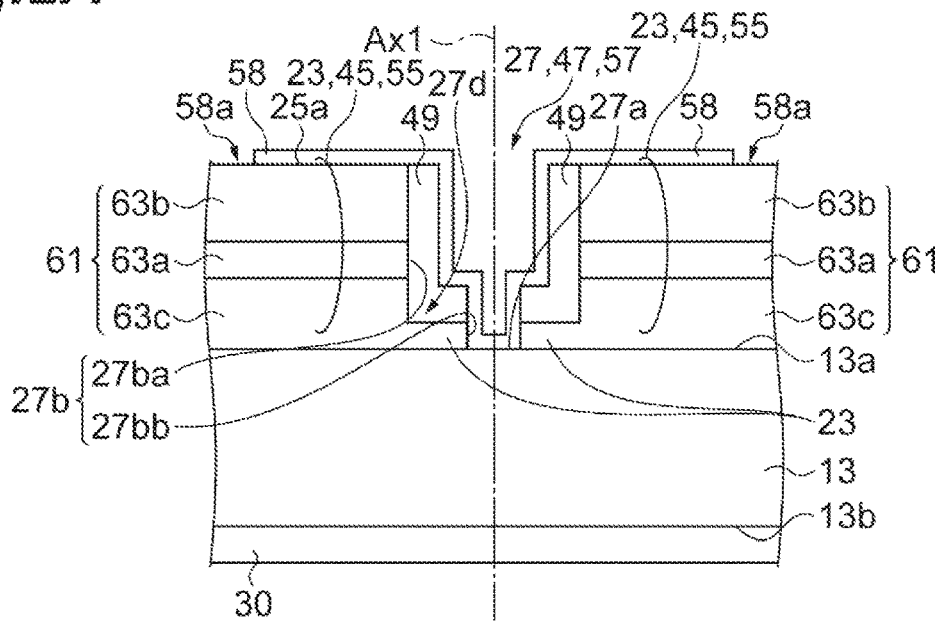
FIG. 2A is a schematic cross sectional view taken along line IIa-IIa shown in FIG. 1.
Figure 2B:
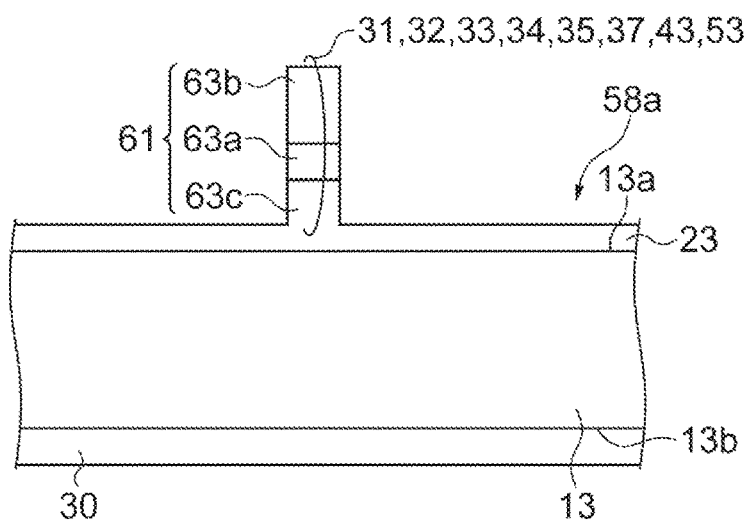
FIG. 2B is a schematic cross sectional view taken along line IIb-IIb shown in FIG. 1.
Figure 2C:
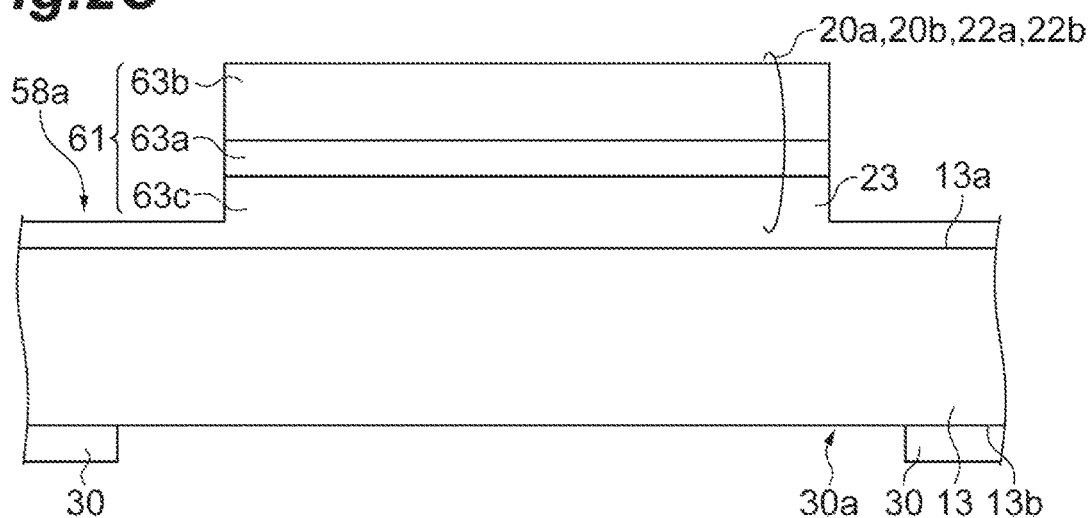
FIG. 2C is a schematic cross sectional view taken along line IIc-IIc shown in FIG. 1.

FIG. 1 is a schematic plan view showing a semiconductor integrated optical device according to the embodiment. FIGS. 2A, 2B and 2C are schematic cross sectional views taken along lines IIa-IIa, IIb-IIb, and IIc-IIc in FIG. 1, respectively. FIGS. 3A and 3B are schematic cross sectional views taken along lines IIIa-IIIa and IIIb-IIIb shown in FIG. 1, respectively.

The semiconductor integrated optical device 11 includes a supporting base 13, a first photoelectric converter 15, a second photoelectric converter 17, a first 90° optical hybrid 19, a second 90° optical hybrid 21, a first-conductivity type semiconductor region 23, a first island semiconductor mesa 25, a first groove 27, and an optical divider mesa 29. In FIG. 1, solid lines indicate semiconductor structures, such as a mesa and a groove, and metal bodies, such as an electrode, in the semiconductor integrated optical device 11. FIGS. 2A to 3B illustrate the respective structures of the semiconductor integrated optical device 11 at the cross sections taken along the lines shown in FIG. 1.

The supporting base 13 has a principal face 13a and a back face 13b, and the principal face 13a is opposite to the back face 13b. The supporting base 13 includes semi-insulating semiconductor. Specifically, the principal face 13a is made of semi-insulating semiconductor. The supporting base 13 has a first region 13c, a second region 13d, a third region 13e, and a fourth region 13f, and the first to fourth regions 13c to 13f are arranged in the direction of the second axis Ax2, which intersects the first axis Ax1. The supporting base 13 includes a semiconductor base, such as a semi-insulating InP substrate, and if necessary, may further have a semiconductor epitaxial layer on the semiconductor base.

The first photoelectric converter 15 has multiple first photodiode mesas 16a and 16b on the supporting base 13, and the first photodiode mesas 16a and 16b may be disposed on the first region 13c. The second photoelectric converter 17 has multiple second photodiode mesas 18a and 18b on the supporting base 13, and the second photodiode mesas 18a and 18b may be disposed on the first region 13c.

The first 90° optical hybrid 19 is disposed on the supporting baser 13, and has a plurality of optical inputs 19a and 19b and a plurality of optical outputs 19c, 19d, 19e, and 19f. Specifically, the first 90° optical hybrid 19 has one or more first multimode waveguide mesas (20a and 20b) on the supporting base 13, and these first multimode waveguide mesas may be disposed on the second region 13d. In the present embodiment, the first multimode waveguide mesa 20a has a semiconductor structure enabling a 2×4 multimode waveguide, and the first multimode waveguide mesa 20b has a semiconductor structure enabling a 2×2 multimode waveguide.

The second 90° optical hybrid 21 is disposed on the supporting baser 13, and has a plurality of optical inputs 21a and 21b and a plurality of optical outputs 21c, 21d, 21e, and 21f. Specifically, the second 90° optical hybrid 21 has one or more second multimode waveguide mesas (22a and 22b) on the supporting base 13, and the second multimode waveguide mesas (22a and 22b) may be disposed on the second region 13d. In the present embodiment, the second multimode waveguide mesa 22a has a semiconductor structure enabling a 2×4 multimode waveguide, and the second multimode waveguide mesa 22b has a semiconductor structure enabling a 2×2 multimode waveguide.

The first-conductivity type semiconductor region 23 has a low specific resistance and is disposed on the principal face 13a of the supporting base 13. The first-conductivity type semiconductor region 23 mounts the first photodiode mesa 16a and 16b, the second photodiode mesa 18a and 18b, the first multimode waveguide mesas 20a and 20b, the second multimode waveguide mesas 22a and 22b, and the first island semiconductor mesa 25.

Specifically, the first-conductivity type semiconductor region 23 mounts the first photodiode mesas 16a and 16b and the second photodiode mesas 18a and 18b on the first region 13c. The first-conductivity type semiconductor region 23 also mounts the first multimode waveguide mesas 20a and 20b and the second multimode waveguide mesas 22a and 22b on the second region 13d. The first-conductivity type semiconductor region 23 mounts the first island semiconductor mesa 25 on the second and third regions 13d and 13e.

The first island semiconductor mesa 25 is disposed on the supporting base 13, and extends between the first 90° optical hybrid 19, in particular the first multimode waveguide mesas 20a and 20b, and the second 90° optical hybrid 21, in particular the second multimode waveguide mesas 22a and 22b, to the boundary between the first and second regions 13c and 13d. In the present embodiment, the first island semiconductor mesa 25 may be disposed on the second and third regions 13d and 13e.

In the second region 13d, the first groove 27 penetrates through the first island semiconductor mesa 25 and the first-conductivity type semiconductor region 23 in the direction of the first axis Ax1, which intersects the principal face 13a of the supporting base 13, to the semi-insulating semiconductor of the supporting base 13. If necessary, the first groove 27 may be disposed in the third region 13e.

The optical divider mesa 29 is disposed on the supporting base 13, specifically the fourth region 13f. The optical divider mesa 29 has a first output and a second output, which are optically coupled to the optical input 19a of the first 90° optical hybrid 19 and the optical input 21a of the second 90° optical hybrid 21, respectively. The optical divider mesa 29 also has an output, which is optically coupled to the reference light input port RP through the waveguide mesa 39. This optical connection allows the optical divider mesa 29 to act as a beam splitter that divides the reference light from the reference light input port RP into reference light beams to supply, to the first and second 90° optical hybrids 19 and 21, the respective reference light beams. Specifically, the first multimode waveguide mesa 20a receives one of the reference light beams at the optical input 19a, and the second multimode waveguide mesa 22a also receives the other of the reference light beams at the optical input 21a.

In addition, the first 90° optical hybrid 19 is optically coupled to the first photoelectric converter 15, and the second 90° optical hybrid 21 is optically coupled to the second photoelectric converter 17.

The semiconductor integrated optical device 11 is provided with the first island semiconductor mesa 25, which is disposed on the second and third regions 13d and 13e and extends between the first and second multimode waveguide mesas 20a and 22a. The semiconductor integrated optical device 11 is provided with the first groove 27, which extends through the first island semiconductor mesa 25 and the first-conductivity type semiconductor region 23 to the semi-insulating semiconductor of the supporting base 13, in the second region 13d. The first island semiconductor mesa 25 allows the first groove 27 to narrow the conductive path of the first-conductivity type semiconductor region 23 connecting the first photodiode mesas 16a and 16b in the first photoelectric converter 15, which are connected to the first 90° optical hybrid 19, with the second photodiode mesas 18a and 18b in the second photoelectric converter 17, which are connected to the second 90° optical hybrid 21. The first groove 27 forces the conductive path to detour.

In addition, the optical divider mesa 29 is optically coupled to both the first 90° optical hybrid 19, i.e., the optical input 19b of the first multimode waveguide mesa 20a, and the second 90° optical hybrid 21, i.e., the optical input 21b of the second multimode waveguide mesa 22a. More specifically, the semiconductor integrated optical device 11 further includes a first input waveguide mesa 31 and a second input waveguide mesa 33, and the first and second input waveguide mesas 31 and 33 are disposed on the third region 13e. The first input waveguide mesa 31 connects the optical divider mesa 29 to the first multimode waveguide mesa 20a. The second input waveguide mesa 33 connects the optical divider mesa 29 to the second multimode waveguide mesa 22a.

In addition, the first and second 90° optical hybrids 19 and 21 receive respective optical signals from the first and second signal input ports S1P and S2P for the X- and Y-channels. Specifically, the first multimode waveguide mesa 20a receives the first signal light at the optical input 19b, and the second multimode waveguide mesa 22a receives the second signal light at the light input 21b.

In addition, the semiconductor integrated optical device 11 further includes a third input waveguide mesa 35 and a fourth input waveguide mesa 37, and the third and fourth input waveguide mesas 35 and 37 are disposed on the third and fourth regions 13e and 13f. The third input waveguide mesa 35 connects the first signal input port S1P to the optical input 19b of the first multimode waveguide mesa 20a, and receives the X-channel signal light from the first signal input port S1P. The fourth input waveguide mesa 37 connects the second signal input port S2P to the optical input 21b of the second multimode waveguide mesa 22a and receives the Y-channel signal light from the second signal input port S2P.

The first and second input waveguide mesas 31 and 33, the third and fourth input waveguide mesas 35 and 37, and the optical divider mesa 29 are mounted on the first-conductivity type semiconductor region 23. Specifically, the first and second input waveguide mesas 31 and 33 may be disposed on the third region 13e. The third and fourth input waveguide mesas 35 and 37 may be disposed on the third and fourth regions 13e and 13f. The optical divider mesa 29 may be disposed on the fourth region 13f.

The second region 13d is adjacent to the first and third regions 13c and 13e. The third region 13e may be adjacent to the fourth region 13f. The first region 13c is located in the photodiode area, and the second, the third, and the fourth regions 13d, 13e and 13f are located in the waveguide area. In the present embodiment, the first, the second, the third and the fourth regions 13c, 13d, 13e, and 13f are arranged in the direction of the second axis Ax2, which intersects the first axis Ax1. The first 90° optical hybrid 19, the first island semiconductor mesa 25 and the second 90° optical hybrid 21 are arranged on the waveguide area in the direction of the third axis Ax3, which intersects the first and second axes Ax1 and Ax2, so that the first island semiconductor mesa 25 separates the first 90° optical hybrid 19 and the second 90° optical hybrid 21 apart from each other. The first and second photoelectric converters 15 and 17 are also arranged in the direction of the third axis Ax3 on the photodiode area, and in the embodiment, the first island semiconductor mesa 25 is not located on the photodiode area.

The first 90° optical hybrid 19 is optically coupled to the first photoelectric converter 15, and specifically, the first multimode waveguide mesa 20a is optically coupled to the first photoelectric converter 15. The first photoelectric converter 15 receives interfering light beams from the light outputs 19e and 19f of the first multimode waveguide mesa 20b. In addition, the second 90° optical hybrid 21 is optically coupled to the second photoelectric converter 17, and specifically, the second multimode waveguide mesa 22a is optically coupled to the second photoelectric converter 17. The second photoelectric converter 17 receives the interfering light beams from the light outputs 21e and 21f of the second multimode waveguide mesa 22b.

The semiconductor integrated optical device 11 further includes one or more first waveguide mesas 32 and one or more second waveguide mesas 34. The first and second waveguide mesas 32 and 34 extend on the supporting base 13, and may be disposed on the second region 13d. The first 90° optical hybrid 19 is optically coupled to the first photoelectric converter 15 through the first waveguide mesas 32. Specifically, the first waveguide mesas 32 connect the optical outputs 19e and 19f of the first multimode waveguide mesa 20b to the first photodiode mesas 16a and 16b, respectively. In addition, the second 90° optical hybrid 21 is optically coupled to the second photoelectric converter 17 through the second waveguide mesas 34. Specifically, the second waveguide mesas 34 connect the optical outputs 21e and 21f of the second multimode waveguide mesa 22a to the second photodiode mesas 18a and 18b, respectively.

The semiconductor integrated optical device 11 further includes a third photoelectric converter 41, third waveguide mesas 43, a second island semiconductor mesa 45, and a second groove 47. The third photoelectric converter 41 has multiple third photodiode mesas 42a and 42b on the supporting base 13, and the third photodiode mesas 42a and 42b may be disposed on the first region 13c. The third waveguide mesas 43 connect the first multimode waveguide mesa 20a to the third photodiode mesas 42a and 42b. The second island semiconductor mesa 45 is disposed on the supporting base 13 between the first and third waveguide mesas 32 and 43, which are connected to the first and third photoelectric converters 15 and 41, respectively, and may be located on the second region 13d. The first waveguide mesa 32, the second island semiconductor mesa 45 and the first waveguide mesa 43 are arranged in the direction of the third axis Ax3. The second groove 47 extends through the second island semiconductor mesa 45 and the first-conductivity type semiconductor region 23 in the direction of the first axis Ax1 to the semi-insulating semiconductor of the supporting base 13.

The semiconductor integrated optical device 11 is provided with the second island semiconductor mesa 45, which is disposed on the second region 13d between the first and third waveguide mesas 32 and 43. The semiconductor integrated optical device 11 is provided with the second groove 47, which extends in the second region 13d through the second island semiconductor mesa 45 and the first-conductivity type semiconductor region 23 to the semi-insulating semiconductor of the supporting base 13. The second island semiconductor mesa 45 allows the second groove 47 to narrow the conductive path of the first-conductivity type semiconductor region 23 connecting the first photodiode mesas 16a and 16b in the first photoelectric converter 15 to the third photodiode mesas 42a and 42b in the third photoelectric converter 41, thereby detouring the second island semiconductor mesa 45.

The semiconductor integrated optical device 11 further includes a fourth photoelectric converter 51, multiple fourth waveguide mesa 53, a third island semiconductor mesa 55, and a third groove 57. The fourth photoelectric converter 51 has multiple fourth photodiode mesas 52a and 52b on the supporting base 13, and the fourth photodiode mesas 52a and 52b may be disposed on the first region 13c. The fourth waveguide mesas 53 connect the second multimode waveguide mesa 22a to the fourth photodiode mesas 52a and 52b. The third island semiconductor mesa 55 is disposed on the supporting base 13 between the second waveguide mesa 34, which is connected to the second photoelectric converter 17, and the fourth waveguide mesa 53, which is connected to the fourth photoelectric converter 51, and may be located on the second region 13d. The third groove 57 extends in the direction of the first axis Ax1 through the third island semiconductor mesa 55 and the first-conductivity type semiconductor region 23 to the semi-insulating semiconductor of the supporting base 13.

The semiconductor integrated optical device 11 allows the third groove 57 to narrow the conductive path between the second photodiode mesas 18a and 18b in the second photoelectric converter 17 and the photodiode mesas 52a and 52b in the fourth photoelectric converter 51. The third island semiconductor mesa 55 can detour the conductive path to make the path long.

Referring to FIG. 1, FIGS. 2A, 2B and 2C and FIGS. 3A and 3B, the first-conductivity type semiconductor region 23 may include multiple first portions 23a and a single second portion 23b. The first portions 23a have respective photodiode mesas, which are arranged on the first region 13c, and the single second portion 23b is disposed over the second, the third and the fourth region 13d, 13e, and 13f. The first portions 23a on the first region 13c are spaced apart from each other, but connected to each other through the second portion 23b on the second region 13d. The first photodiode mesas 16a and 16b of the first photoelectric converter 15 may be disposed on, for example, respective ones among the first portions 23a. The second photodiode mesas 18a and 18b of the second photoelectric converter 17 may be disposed on, for example, other respective ones among the first portion 23a.

The single second portion 23b of the first-conductivity type semiconductor region 23 mounts the first multimode waveguide mesas 20a and 20b, the second multimode waveguide mesas 22a and 22b, the first waveguide mesas 32, the second waveguide mesas 34, the third waveguide mesas 43, the fourth waveguide mesas 53, the optical divider mesa 29, the first input waveguide mesa 31, the second input waveguide mesa 33, the third input waveguide mesa 35, and the fourth input waveguide mesa 37.

The first-conductivity type semiconductor region 23 may further include a third portion 23c. The third portion 23c is disposed on the second and third regions 13d and 13e, and is separated apart from the first island semiconductor mesa 25 by the first groove 27. The second and third portions 23b and 23c mount the first island semiconductor mesa 25.

The first-conductivity type semiconductor region 23 may further include a fourth portion 23d. The fourth portion 23d is disposed on the second region 13d, and separated apart from the second portion 23b by the second groove 47 of the second island semiconductor mesa 45. The second and fourth portions 23b and 23d mount the second island semiconductor mesa 45.

The first-conductivity type semiconductor region 23 may further include a fifth portion 23e. The fifth portion 23e is disposed on the second region 13d and spaced apart from the second portion 23b by the third groove 57 of the third island semiconductor mesa 55. The second and fifth portions 23b and 23e mount the third island semiconductor mesa 55.

The first waveguide mesa 32, the second waveguide mesa 34, the third waveguide mesa 43, and the fourth waveguide mesa 53 are optically coupled with the first photodiode mesas 16a and 16b, the second photodiode mesas 18a and 18b, the third photodiode mesas 42a and 42b and the fourth photodiode mesas 52a and 52b through respective butt joints (BJ).

The first-conductivity type semiconductor region 23 may be provided with a boundary 23f distant from the butt joints (BJ), and the boundary 23f may be used to define the boundary between the first and second regions 13c and 13d. The first, the second, and the third grooves 27, 47 and 57 extend inward from the outer edge 23f of the first-conductivity type semiconductor region 23.

As shown in FIGS. 2A, 2B and 2C, the semiconductor integrated optical device 11 provides, with a semiconductor laminate 61, the first multimode waveguide mesas 20a and 20b, the second multimode waveguide mesas 22a and 22b, the first waveguide mesa 32, the second waveguide mesa 34, the third waveguide mesa 43, the fourth waveguide mesa 53, the optical divider mesa 29, the first input waveguide mesa 31, the second input waveguide mesa 33, the third input waveguide mesa 35, the fourth input waveguide mesa 37, the first island semiconductor mesa 25, the second island semiconductor mesa 45, and the third island semiconductor mesa 55. The semiconductor laminate 61 includes a core semiconductor layer 63a, an upper cladding layer 63b, and a lower cladding region 63c. The core semiconductor layer 63a is disposed on the first-conductivity type semiconductor region 23. The upper cladding layer 63b has a high specific resistance and is disposed on the core semiconductor layer 63a. The lower cladding region 63c includes a first conductivity type semiconductor which lies under the core semiconductor layer 63a. The upper cladding layer 63b, the lower cladding region 63c, and the first-conductivity type semiconductor region 23 each have a smaller refractive index than that of the core semiconductor layer 63a.

With reference to FIGS. 3A and 3B, a description will be given of the structure of the photodiode (specifically, the first and third photoelectric converters 15 and 41 for the X channel and the second and fourth photoelectric converters 17 and 51 for the Y channel). The first photodiode mesas 16a and 16b each include, for example, a semiconductor laminate 65. The semiconductor laminate 65 includes a light absorbing layer 67a and a second-conductivity type semiconductor region 67b. The light absorption layer 67a is disposed on the first-conductivity type semiconductor region 23, and the second-conductivity type semiconductor region 67b is disposed on the light absorption layer 67a.

As shown in FIGS. 3A and 3B, the first waveguide mesa 32 forms a butt-joint (BJ) with each of the first photodiode mesas 16a and 16b. Similarly, the second waveguide mesa 34 forms a butt-joint (BJ) with each of the second photodiode mesas 18a and 18b.

The first photoelectric converter 15 (and the second photoelectric converter 17) has an upper electrode 69a on each of the first photodiode mesas, and a lower electrode 69b on each of the first portions 23a of the first-conductivity type semiconductor region 23 for the first photoelectric converter 15 (the second photoelectric converter 17).

As shown in FIGS. 2A, 2B and 2C and FIGS. 3A and 3B, the semiconductor integrated optical device 11 further includes an insulating layer 58. The insulating layer 58 covers the first photodiode mesas 16a and 16b, the second photodiode mesas 18a and 18b, the third photodiode mesas 44a and 44b, the fourth photodiode mesas 52a and 52b, and may further cover a part or the whole of the first island semiconductor mesa 25, a part or the whole of the second island semiconductor mesa 45, and a part or the whole of the third island semiconductor mesa 55. The insulating layer 58 has respective openings 58a on the first multimode waveguide mesas 20a and 20b, the second multimode waveguide mesas 22a and 22b, and the optical divider mesa 29.

The insulating layer 58 is disposed in the first, the second and the third grooves 27, 47 and 57. The semiconductor integrated optical device 11 is provided with the insulating layer 58 that cover the first, the second, and the third island semiconductor mesas 25, 45 and 55, and the first-conductivity type semiconductor region 23.

If necessary, the semiconductor integrated optical device 11 may further include a high specific-resistance semiconductor layer 49. The high specific-resistance semiconductor layer 49 covers the faces of the first, the second and third island semiconductor mesas 25, 45 and 55 and the face of the first-conductivity type semiconductor region 23 in the first, the second and the third grooves 27, 47 and 57, The semiconductor integrated optical device 11 allows the high specific-resistance semiconductor layer 49 to make contact with the first, the second, and the third island semiconductor mesas 25, 45 and 55, and the first-conductivity type semiconductor region 23.

The first groove 27 (the second and third grooves 47 and 57) has a bottom face 27a and a side face 27b. The side face 27b extends to connect the upper face 25a of the first island semiconductor mesa 25 (the second and the third island semiconductor mesas 45 and 55) to the bottom face 27a. The side face 27b has a first portion 27ba, which is contained in the first island semiconductor mesa 25, and a second portion 27bb, which is contained in the first-conductivity type semiconductor region 23. The side face 27b of the first groove 27 has a terrace, which extends inward to form a difference in level 27d, and the high specific-resistance semiconductor layer 49 is disposed on the difference in level 27d. The high specific-resistance semiconductor layer 49 covers the first-conductivity type semiconductor region 23 and the conductive semiconductor of the first island semiconductor mesa 25.

Exemplary semiconductor integrated optical device 11
Upper cladding layer 63b: i-type InP
Core semiconductor layer 63a: i-type GaInAsP
Lower cladding region 63c: n-type InP
First-conductivity type semiconductor region 23: n-type InP
Light absorbing layer 67a: i-type GaInAs
Second-conductivity type semiconductor region 67b: p-type InP cladding, p-type GaInAs contact layer
High specific-resistance semiconductor layer 49: i-type InP
Insulating layer 58: silicon-based inorganic insulator, for example SiN With reference to FIGS. 3A and 3B, a description will be given of the structure of the photodiode (the first and third photoelectric converters 15 and 41 for the X-channel, and the second and fourth photoelectric converters 17 and 51 for the Y-channel). Each of the first photodiode mesas 16a and 16b is provided with, for example, the semiconductor laminate 65, which has a light absorption layer 67a on the first-conductivity type semiconductor region 23, and a second-conductivity type semiconductor region 67b on the light absorption layer 67a.

As shown in FIGS. 3A and 3B, the first waveguide mesa 32 forms a butt-joint (BJ) with each of the first photodiode mesas 16a and 16b. Similarly, the second waveguide mesa 34 forms a butt joint (BJ) with each of the second photodiode mesas 18a and 18b.

Referring to FIG. 1, if needed, the semiconductor integrated optical device 11 has a fourth island semiconductor mesa 59a and a fifth island semiconductor mesa 59b on the supporting base 13, and the fourth and fifth island semiconductor mesas 59a and 59b may be disposed on the fourth region 13f. The fourth island semiconductor mesa 59a may be disposed between the third input waveguide mesa 35 and the optical divider mesa 29, the first input waveguide mesa 31, and the waveguide mesa 39. The fifth island semiconductor mesa 59b may be disposed between the fourth input waveguide mesa 37 and the optical divider mesa 29, the first input waveguide mesa 31, and the second input waveguide mesa 33.

The semiconductor integrated optical device 11 may have a first semiconductor terrace 59c and a second semiconductor terrace 59d on the supporting base 13, and the first and second semiconductor terraces 59c and 59d may be located on the second, the third and the fourth regions 13d, 13e, and 13f. The first 90° optical hybrid 19, the second 90° optical hybrid 21 and the optical divider mesa 29 may be disposed between the first and second semiconductor terraces 59c and 59d.

The semiconductor integrated optical device 11 may include a spot size converter, which is disposed at each of the input ends of the waveguide mesas 35, 37 and 39.

The semiconductor integrated optical device 11 may have a backside metal layer 30 on the back side 13b of the supporting base 13 as shown in FIGS. 2A, 2B and 2C and FIGS. 3A and 3B. The backside metal layer 30 has one or more openings 30a, and the openings 30a are positioned to the first 90° optical hybrid 19, the second 90° optical hybrid 21 and the optical divider mesa 29.

With reference to FIGS. 4 to 14C, a description will be given of major steps in a method for fabricating a semiconductor integrated optical device below. To facilitate understanding, reference numerals that are used in the description with reference to FIG. 1, FIGS. 2A, 2B and 2C and FIGS. 3A and 3B are used in the following description, where possible.

Figure 4:
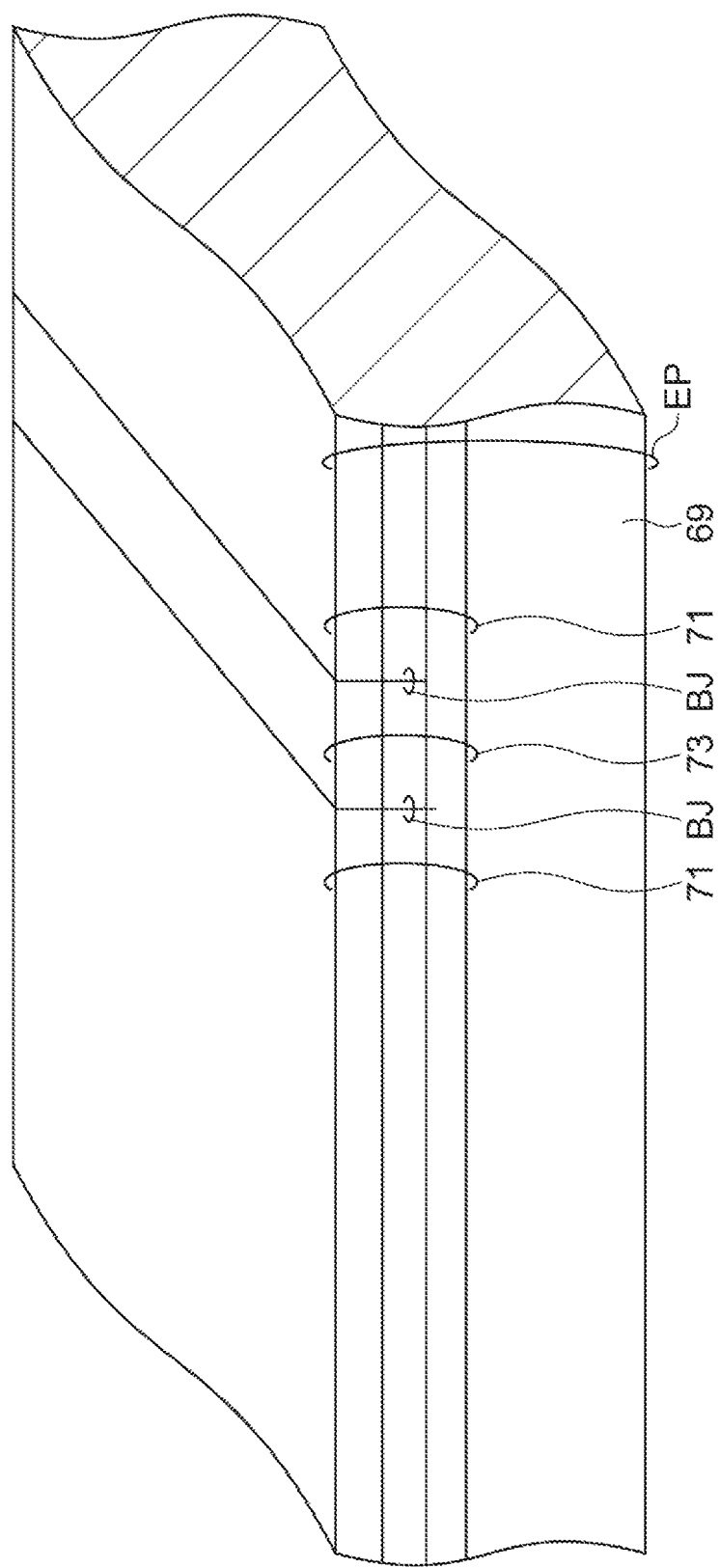
FIG. 4 is a perspective view showing an epi-product formed in a step in a method for fabricating a semiconductor integrated optical device according to the embodiment.

FIG. 4 is a schematic view showing an epi-product EP prepared in the present embodiment, and the epi-product EP can be prepared by fabricating the epi-product EP in the following steps. The epi-product EP is formed by crystal growth of semiconductor, such as metal organic chemical vapor deposition. The epi-product EP may include a substrate 69 for growth, such as a semi-insulating semiconductor wafer, a first epitaxial structure 71 for the semiconductor laminate 61, and a second epitaxial structure 73 for the semiconductor laminate 65. The first epitaxial structure 71 forms a butt-joint BJ with the second epitaxial structure 73 for the semiconductor laminate 65.

Figure 5:
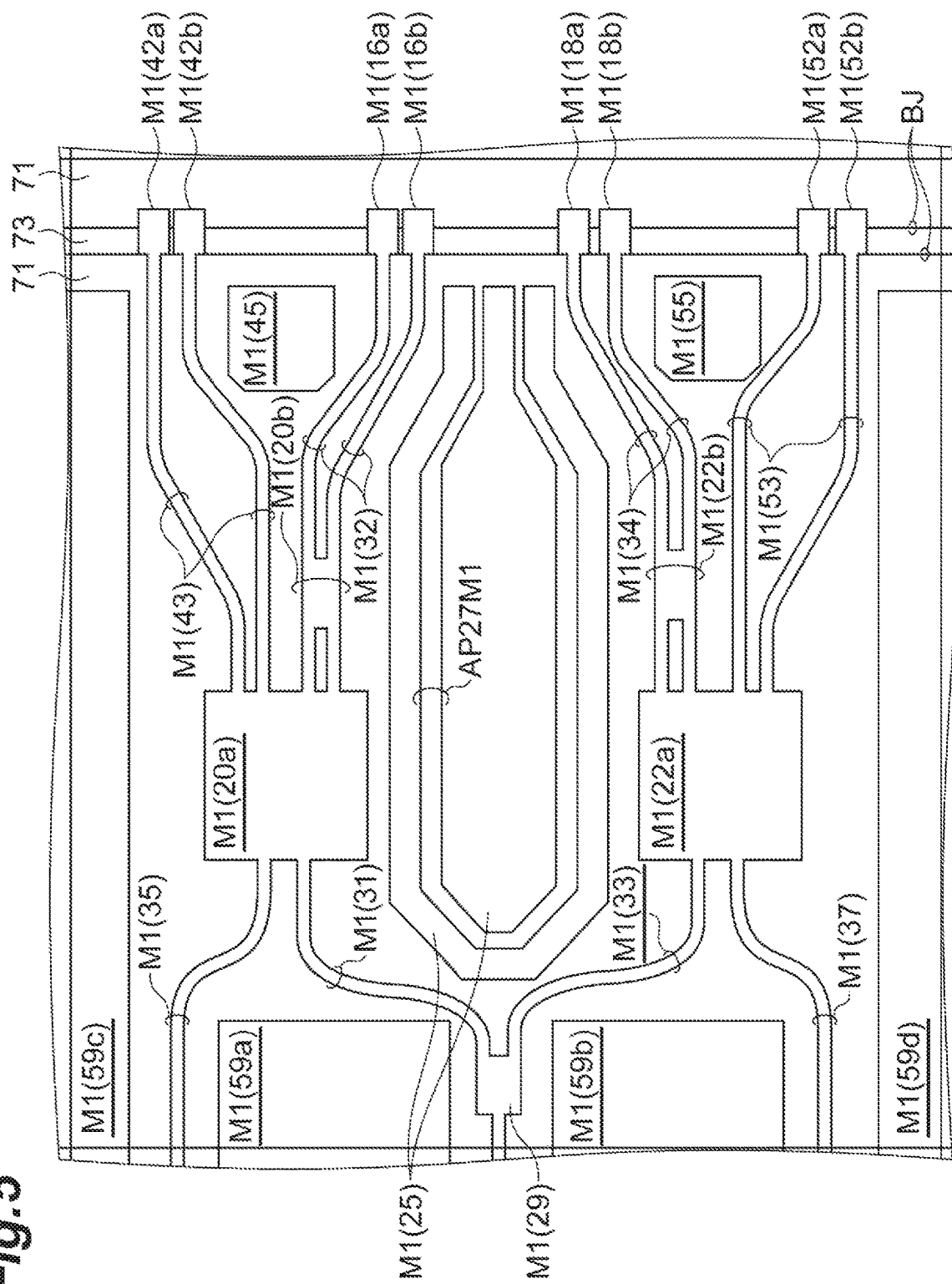
FIG. 5 is a schematic plan view showing a major step in the method according to the embodiment.

Illustration of the epi-product EP
Substrate for growth 69: Fe-doped InP
First epitaxial structure 71
Semiconductor film for the first-conductivity type semiconductor region 23 and the lower cladding region 63c: n-type InP
Semiconductor film for the core semiconductor layer 63a: i-type GaInAsP
Semiconductor film for the upper cladding layer 63b: i-type InP
Second epitaxial structure 73
Semiconductor film for the first-conductivity type semiconductor region 23: n-type InP
Semiconductor film for the light absorbing layer 67a: i-type GaInAs
Semiconductor film for the second-conductivity type semiconductor region 67b: p-type InP cladding layer and p-type GaInAs contact layer FIG. 5 is a schematic plan view showing the pattern of the mask in a device section on the wafer. A first mask M1 is formed on the epi-product EP by film deposition, photolithography and etching. As shown in FIG. 5, the first mask M1 has a pattern which defines the shapes of the following mesas: photodiode mesas, such as the first photodiode mesas 16a and 16b; multimode waveguide mesas, such as the first multimode waveguide mesas 20a and 20b, the second multimode waveguide mesas 22a and 22b, and the optical divider mesa 29; single mode waveguide mesas, such as the first waveguide mesa 32, the second waveguide mesa 34, the third waveguide mesa 43, the first input waveguide mesa 31, the second input waveguide mesa 33, the third input waveguide mesa 35, and the fourth input waveguide mesa 37; island and terrace semiconductor mesas, such as the first island semiconductor mesa 25, the second island semiconductor mesa 45, the third island semiconductor mesa 55, the fourth island semiconductor mesa 59a, the fifth island semiconductor mesa 59b, the first semiconductor terrace 59c, and the second semiconductor terrace 59d. In the present embodiment, the first mask M1 may have a strip-shaped opening to define a groove structure, such as a first groove 27 to be formed in the first island semiconductor mesa 25. If necessary, the first mask M1 may have a strip-shaped opening AP25M1 to define another groove structure, such as the second and third grooves 47 and 57 disposed respectively in the second and third island semiconductor mesas 45 and 55. The first mask M1 includes a silicon-based inorganic insulating film, such as a SiN film. The mask patterns that define the first, the second, the third and the fourth waveguide mesas 32, 34, 43 and 53 extend to cross the butt-joint BJ.

Figure 6:
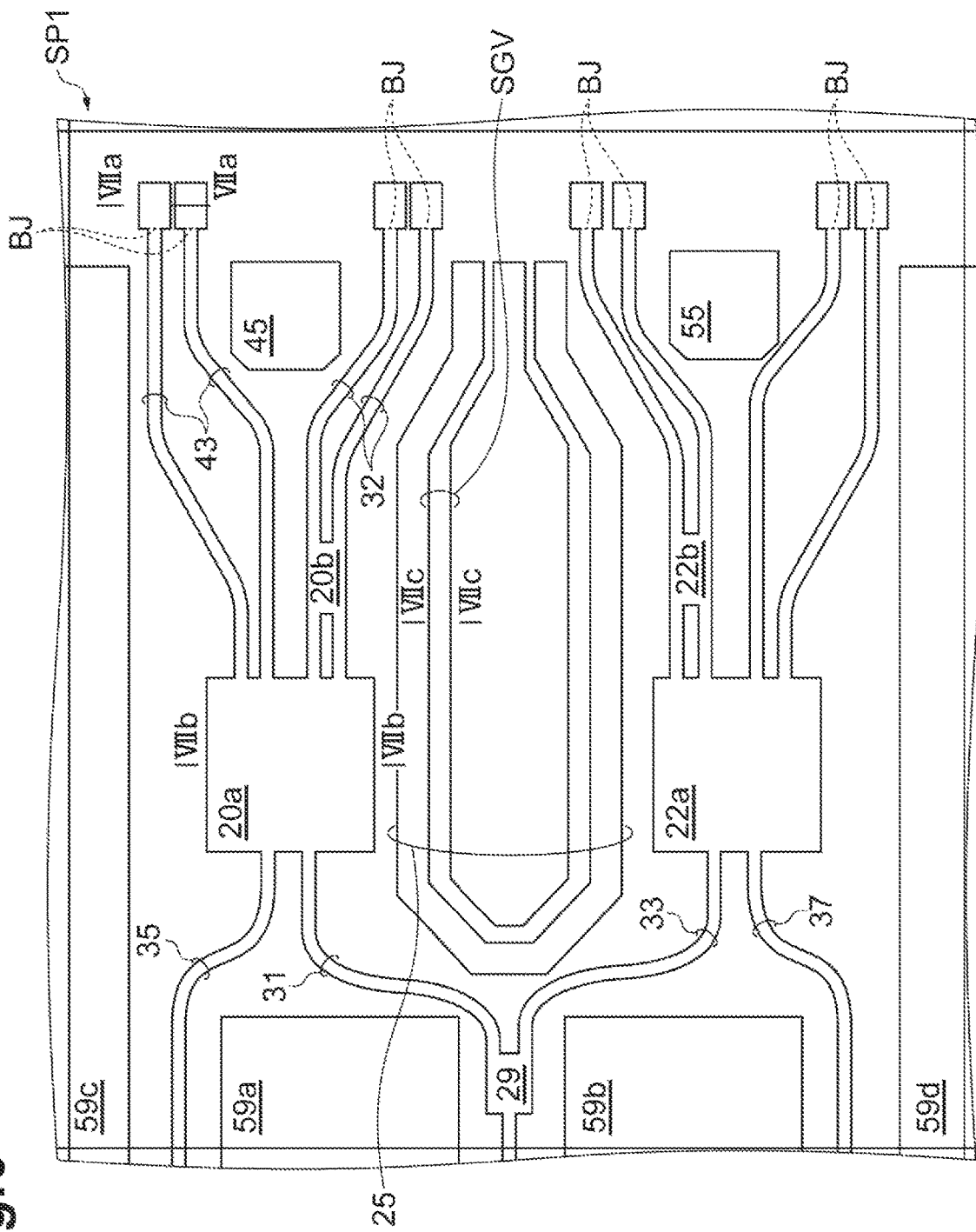
FIG. 6 is a schematic plan view showing a major step in the method according to the embodiment.

FIG. 6 is a schematic plan view showing a device section containing a mesa fabricated by etching with the first mask. After preparing the first mask M1, the epi-product EP is etched with the first mask M1 to form a first substrate product SP1 including the following mesas: photodiode mesas, such as the first photodiode mesa 16a and 16b; the first multimode waveguide mesas 20a and 20b; the second multimode waveguide mesas 22a and 22b; the first waveguide mesa 32; the second waveguide mesa 34; the third waveguide mesa 43; the fourth waveguide mesa 53; the optical divider 29; the first input waveguide mesa 31; the second input waveguide mesa 33; the third input waveguide mesa 35; the fourth input waveguide mesa 37; the first island semiconductor mesa 25; the second island semiconductor mesa 45; the third island semiconductor mesa 55; the fourth island semiconductor mesa 59a; the fifth island semiconductor mesa 59b; the first semiconductor terrace 59c and the second semiconductor terrace 59d.

FIGS. 7A, 7B and 7C are schematic cross sectional views taken along lines VIIa-VIIa, VIIb-VIIb, and VIIc-VIIc shown in FIG. 6, respectively. The above mesas each have a bottom in the semiconductor film (for example, n-type InP) for the first-conductivity type semiconductor region 23, and accordingly include the upper portion (63c) of the first-conductivity type semiconductor region 23. FIGS. 7A, 7B and 7C show the cross sections of the photodiode mesa, such as the first photodiode mesas 16a and 16b, the waveguide mesa, such as the first multimode waveguide mesas 20a and 20b, and the shallow groove SGV for the groove structure, such as the first groove 27. The shallow groove SGV, which is provided with the groove structure, such as the second and third grooves 47 and 57, is formed in each of the second and third island semiconductor mesas 45 and 55, and is defined by the strip-shaped opening of the second mask M2.

FIGS. 8A, 8B and 8C show the progress of the cross sections taken along lines VIIa-VIIa, VIIb-VIIb, and VIIc-VIIc shown in FIGS. 7A, 7B and 7C, respectively. In the subsequent process, a mask is prepared for selectively growing a high specific-resistance semiconductor in the groove SGV. Specifically, after forming the semiconductor mesa by dry-etching with the first mask M1, the silicon-based inorganic insulating film 75 is deposited on the entire surface of the first substrate product SP1 with the first mask M1. As shown in FIGS. 8A, 8B and 8C, the silicon-based inorganic insulating film 75 is formed on the top and side faces of the photodiode mesas, the multimode waveguide mesas, the island semiconductor mesas, the waveguide mesas, the optical divider mesa and the input waveguide mesas, in addition to the silicon-based inorganic insulating layer of the first mask M1, so that the silicon-based inorganic insulating film 75 covers the side faces of the photodiode mesas, the multimode waveguide mesas, the island semiconductor mesas, the optical divider mesas, and the input waveguide mesas.

FIGS. 9A, 9B and 9C show the progress of the cross sections shown in FIGS. 8A, 8B and 8C, respectively. After growing the silicon-based inorganic insulating film 75, a resist mask RM is formed on the silicon-based inorganic insulating film 75 of the first substrate product SP1. The resist mask RM has both a pattern and openings AP. The pattern covers the top and side faces of the multimode waveguide mesas, the waveguide mesas, the optical divider mesas, and the input waveguide mesas, and the openings AP are disposed on the photodiode mesas and the island semiconductor mesas. The application of wet etching to the first substrate product SP1 with the resist mask RM removes a layer of insulating material by a thickness of the silicon-based inorganic insulating film 75 to form the second mask M2 of the silicon-based inorganic insulator. After this wet etching, the resist mask RM is removed.

Figure 10:
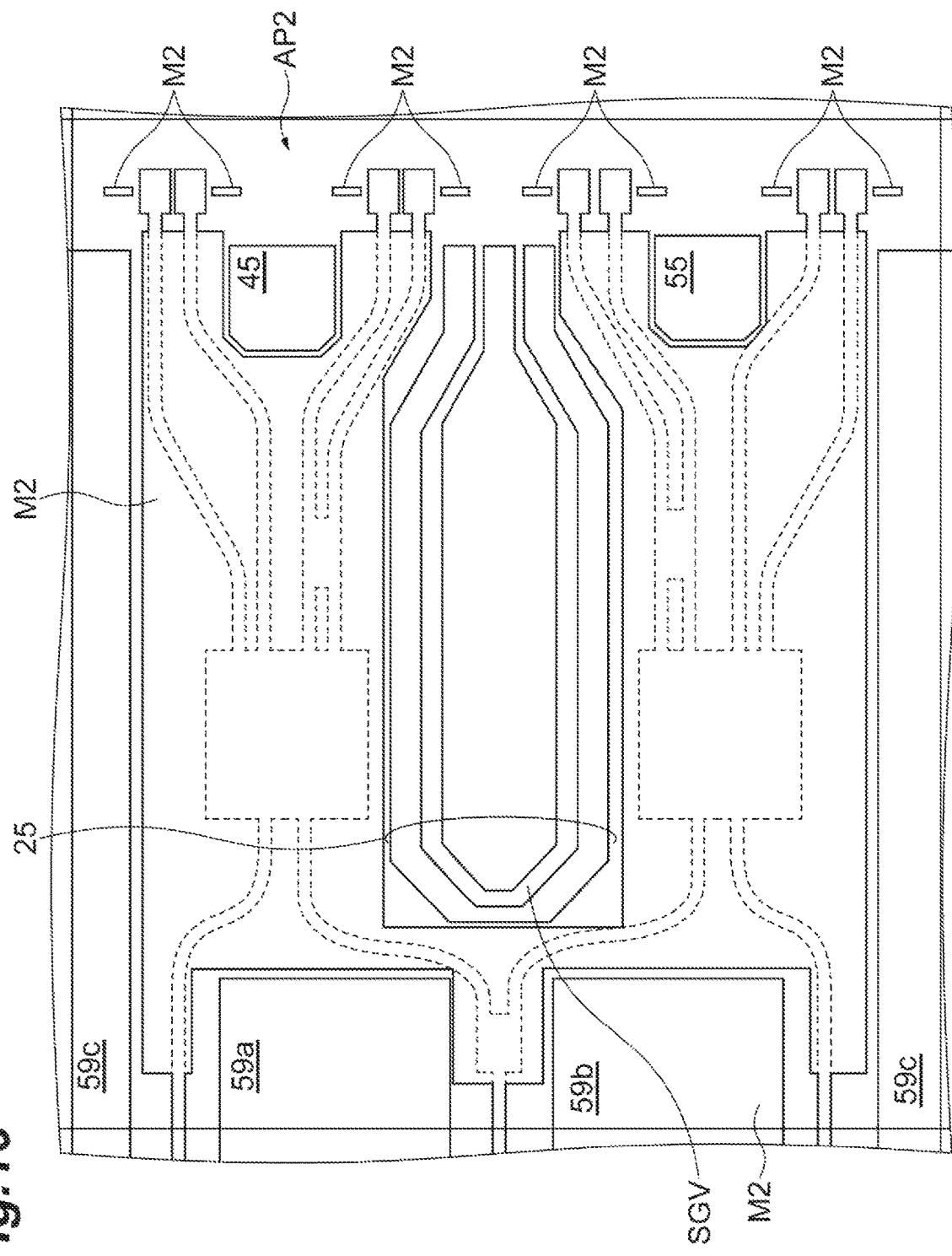
FIG. 10 is a schematic plan view showing a major step in the method according to the embodiment.

FIG. 10 is a schematic plan view showing the shape of the second mask in a device section. FIGS. 11A, 11B and 11C show the progress of the cross sections shown in FIGS. 9A, 9B and 9C, respectively. The second mask M2 is formed on the top faces (outside the side and bottom faces of the grooves) of the photodiode mesas and the island semiconductor mesas, and the top and side faces of the multimode waveguide mesas, the waveguide mesas, the optical divider mesa, and the input waveguide mesas. The second mask M2 may have an opening AP2, and the side face of the photodiode mesas and the side and bottom faces of the shallow grooves SGV in the island semiconductor mesas appear in the opening AP2.

FIGS. 12A, 12B and 12C show the progress of the cross sections shown in FIGS. 11A, 11B and 11C, respectively. The second mask M2 allows high specific-resistance semiconductor (49) to grow on a desired area defined by the openings thereof. Specifically, the high specific-resistance semiconductor, such as i-type InP, is deposited in the opening AP2 of the second mask M2. The pattern of the second mask M2 can prevent the high specific-resistance semiconductor from being grown on the top face of the semiconductor mesa, which is covered with the second mask M2. The opening AP2 of the second mask M2 allows the selective growth of the high specific-resistance semiconductor on, for example, the side face of the semiconductor mesas, specifically, the side and bottom faces of the shallow groove SGV. The deposition with the second mask M2 results in that the high specific-resistance semiconductor layer is not disposed on both the top faces of the photodiode mesas and the contact region of the photodiodes. After deposition of the high specific-resistance semiconductor, the second mask M2 is removed to from a second substrate product SP2.

Figure 13:
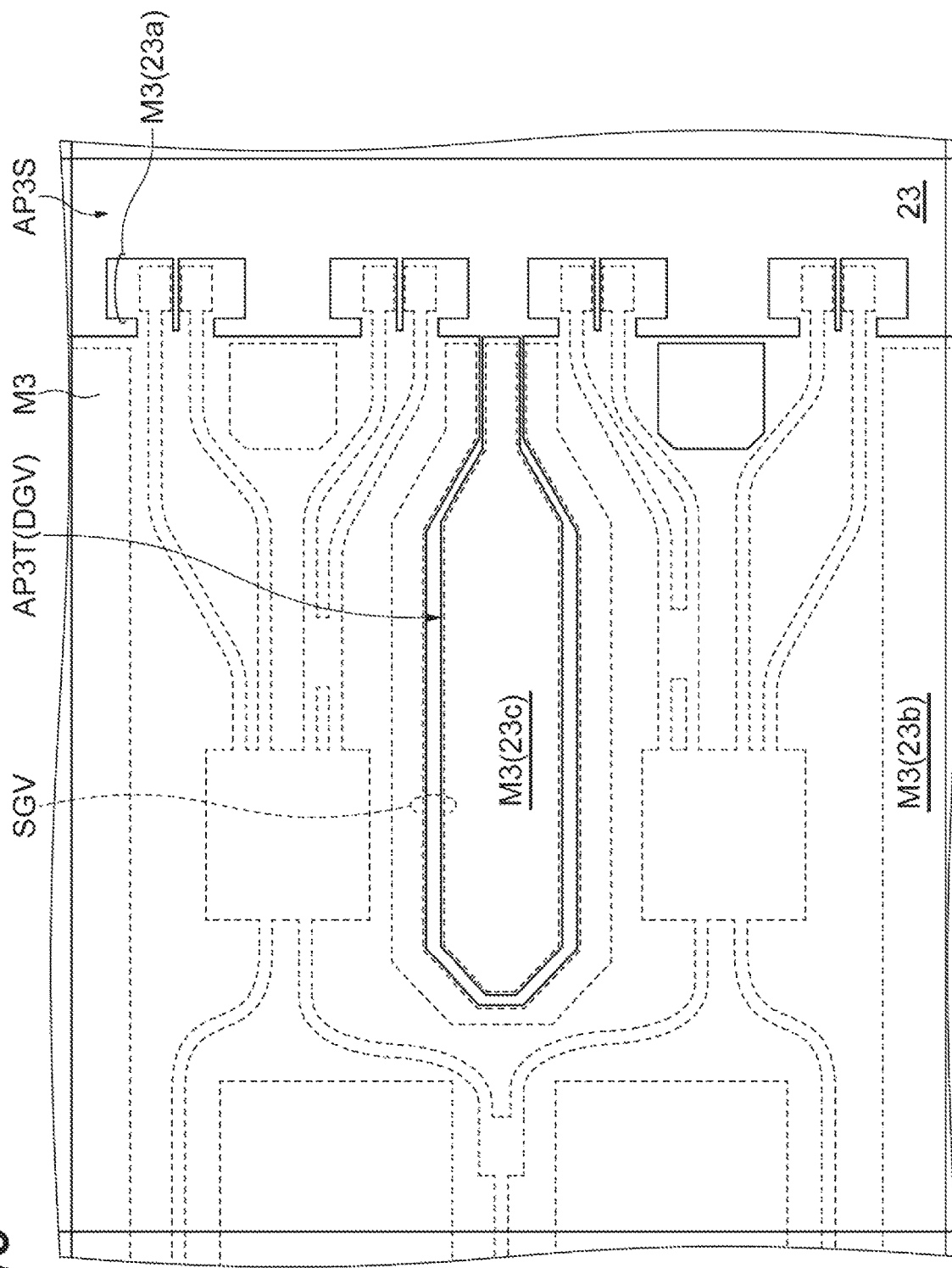
FIG. 13 is a schematic plan view showing a major step in the method according to the embodiment.

After removing the second mask M2, a deep groove is formed at the bottom face of the groove structure, which is covered with the high specific-resistance semiconductor. Forming the deep groove uses the following etching process with a third mask M3. FIG. 13 is a schematic plan view showing the shape of the third mask in a device section on the wafer. The third mask M3 may have a pattern to define the deep groove inside the shallow groove SGV for the first groove 27. In the present embodiment, the third mask M3 has a strip opening AP3T on the bottom face of the shallow groove SGV and an opening AP3S outside the every mesa. The strip opening AP3T starts from the opening AP3S and returns the opening AP3S. The third mask M3 may include a silicon-based inorganic insulating film, such as an SiN film.

Figure 14C:
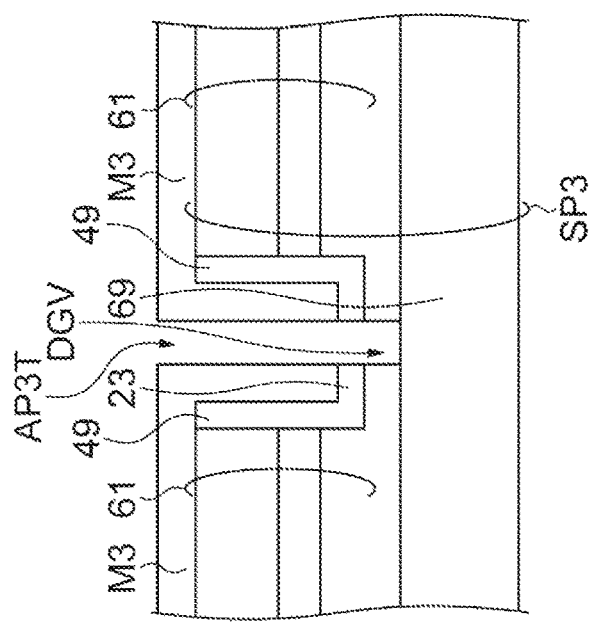
FIG. 14C is a schematic cross sectional view showing a major step in the method according to the embodiment.
Figure 14B:
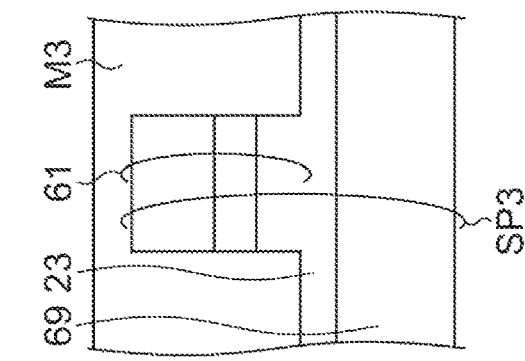
FIG. 14B is a schematic cross sectional view showing a major step in the method according to the embodiment.
Figure 14A:
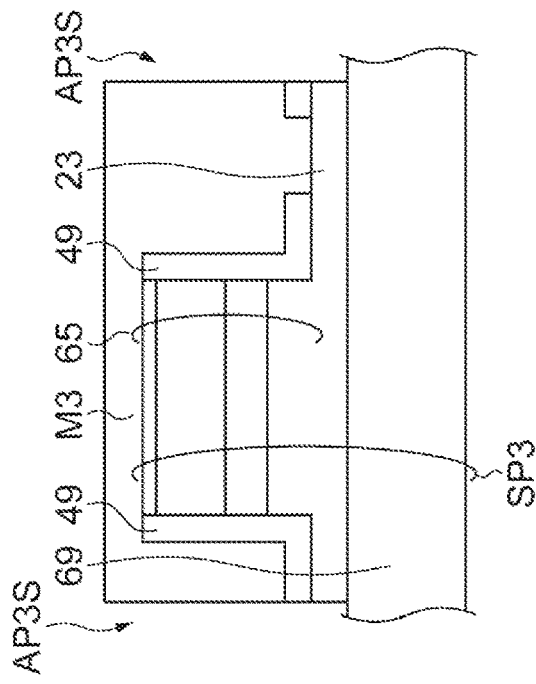
FIG. 14A is a schematic cross sectional view showing a major step in the method according to the embodiment.

FIGS. 14A, 14B and 14C show the progress of the cross sections shown in FIGS. 12A, 12B and 12C, respectively. Dry etching process with the third mask can form the deep groove DGV at the strip opening AP3T, and after the dry etching, the third mask M3 is removed to obtain a third substrate product SP3. The third substrate product SP3 includes a first portion 23a, a second portion 23b, and a third portion 23c, which mount the photodiode mesas.

After removing the third mask M3, an insulating layer 58 for passivation is formed on the third substrate product SP3. The insulating layer 58 has an opening on the multimode waveguide mesas, the island semiconductor mesas, the waveguide mesas, the optical divider mesa and the input waveguide mesas, and covers the top and side faces of the photodiode mesas. The insulating layer 58 has openings on the anode and cathode areas of each of the photodiode mesas, and these openings enable electrical contact to the anode and cathode. A metallization process forms an upper electrode 69a, such as an anode electrode, and a lower electrode 69b, such as a cathode electrode on the respective openings.

The above fabricating processes bring the semiconductor integrated optical device to completion.

The present embodiment provides the semiconductor integrated optical device for an optical receiving module that can reduce electrical crosstalk.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A semiconductor integrated optical device comprising:
a supporting base including semi-insulating semiconductor;
a conductive semiconductor region disposed on a principal face of the supporting base;
a first photoelectric convertor having first photodiode mesas on the conductive semiconductor region;
a second photoelectric convertor having second photodiode mesas on the conductive semiconductor region;
a first 90° optical hybrid optically coupled to the first photoelectric convertor, the first 90° optical hybrid having at least one first multimode waveguide mesa on the conductive semiconductor region;
a second 90° optical hybrid optically coupled to the second photoelectric convertor, the second 90° optical hybrid having at least one second multimode waveguide mesa on the conductive semiconductor region;
an optical divider mesa disposed on the supporting base;
a first input waveguide mesa disposed on the conductive semiconductor region, the first input waveguide mesa coupling the optical divider mesa with the first 90° optical hybrid;
a second input waveguide mesa disposed on the conductive semiconductor region, the second input waveguide mesa coupling the optical divider mesa with the second 90° optical hybrid;
a first island semiconductor mesa extending between the first multimode waveguide mesa and the second multimode waveguide mesa, the first island semiconductor mesa being disposed on the conductive semiconductor region; and a first groove extending in a direction of a first axis to penetrate through the first island semiconductor mesa and the conductive semiconductor region to the semi-insulating semiconductor of the supporting base, the first axis intersecting the principal face.

2. The semiconductor integrated optical device according to claim 1, wherein the supporting base has a first region, a second region, a third region, and a fourth region, the first region, the second region, the third region, and the fourth region are arranged along a second axis intersecting the first axis, the first photodiode mesas of the first photoelectric convertor are disposed on the first region, the second photodiode mesas of the second photoelectric convertor are disposed on the first region, the first multimode waveguide mesa of the first 90° optical hybrid is disposed on the second region, the second multimode waveguide mesa of the second 90° optical hybrid is disposed on the second region, the optical divider mesa is disposed on the fourth region, the first input waveguide mesa is disposed on the third region, the second input waveguide mesa is disposed on the third region, and the first island semiconductor mesa is disposed on the second region and the third region.

3. The semiconductor integrated optical device according to claim 1, further comprising:

a first waveguide mesa connecting the first multimode waveguide mesa with one of the first photodiode mesas;

a second waveguide mesa connecting the second multimode waveguide mesa with one of the second photodiode mesas;

a third photoelectric convertor having third photodiode mesas on the supporting base;

a third waveguide mesa connecting the first multimode waveguide mesa with one of the third photodiode mesas;

a second island semiconductor mesa extending between the first waveguide mesa and the third waveguide mesa, the second island semiconductor mesa being disposed on the conductive semiconductor region and the supporting base; and a second groove extending in the direction of the first axis to penetrate through the second island semiconductor mesa and the conductive semiconductor region to the semi-insulating semiconductor of the supporting base.

4. The semiconductor integrated optical device according to claim 2, further comprising:

a first waveguide mesa connecting the first multimode waveguide mesa with one of the first photodiode mesas;

a second waveguide mesa connecting the second multimode waveguide mesa with one of the second photodiode mesas;

a third photoelectric convertor having third photodiode mesas on the first region;

a third waveguide mesa connecting the first multimode waveguide mesa with one of the third photodiode mesas;

a second island semiconductor mesa extending between the first waveguide mesa and the third waveguide mesa, the second island semiconductor mesa being disposed on the second region and the conductive semiconductor region; and a second groove extending in the direction of the first axis to penetrate through the second island semiconductor mesa and the conductive semiconductor region to the semi-insulating semiconductor of the supporting base.

5. The semiconductor integrated optical device according to claim 1, further comprising an insulating layer having openings on the first multimode waveguide mesa and the second multimode waveguide mesa, the insulating layer covering the first photodiode mesas, the second photodiode mesas, and the first island semiconductor mesa, and the insulating layer being disposed in the first groove.

6. The semiconductor integrated optical device according to claim 1, further comprising a high specific-resistance layer covering the first island semiconductor mesa and the conductive semiconductor region, and the high specific-resistance layer having a specific resistance higher than that of the conductive semiconductor region.

7. The semiconductor integrated optical device according to claim 2, further comprising a high specific-resistance layer covering the first island semiconductor mesa and the conductive semiconductor region on the first region, and the high specific-resistance layer having a specific resistance higher than that of the conductive semiconductor region.

* * * * *